United States Patent [19]

Nagasawa et al.

[11] Patent Number: 5,444,653
[45] Date of Patent: Aug. 22, 1995

[54] SEMICONDUCTOR MEMORY DEVICE WITH STACK TYPE MEMORY CELL

[75] Inventors: Hideharu Nagasawa; Kazunari Honma; Yasuhiro Takeda; Kiyoshi Yoneda, all of Gifu, Japan

[73] Assignee: Sanyo Electric Co., Ltd., Osaka, Japan

[21] Appl. No.: 227,509

[22] Filed: Apr. 13, 1994

[30] Foreign Application Priority Data

Apr. 26, 1993 [JP] Japan .................................. 5-99777

[51] Int. Cl.6 .............................................. H01L 29/68
[52] U.S. Cl. .................... 365/149; 257/296; 257/306; 257/307; 257/308
[58] Field of Search ............... 365/149; 257/306, 307, 257/308, 309, 310, 296

[56] References Cited

U.S. PATENT DOCUMENTS

| | | | |
|---|---|---|---|
| 4,951,175 | 8/1990 | Kurosawa et al. | 361/313 |
| 5,026,659 | 6/1991 | Lee | 437/52 |
| 5,091,761 | 2/1992 | Hiraiwa et al. | 257/306 |
| 5,101,251 | 3/1992 | Wakamiya et al. | 257/306 |
| 5,183,772 | 2/1993 | Jin et al. | 437/52 |
| 5,185,284 | 3/1993 | Motonami | 437/52 |
| 5,225,698 | 7/1993 | Kim et al. | 257/303 |
| 5,323,037 | 6/1994 | Su | 257/306 |

FOREIGN PATENT DOCUMENTS

| | | |
|---|---|---|
| 3-19280 | 1/1991 | Japan . |
| 3-21064 | 1/1991 | Japan . |
| 4-139761 | 5/1992 | Japan . |

*Primary Examiner*—David C. Nelms
*Assistant Examiner*—Vu Le
*Attorney, Agent, or Firm*—Sheridan Ross & McIntosh

[57] ABSTRACT

Disclosed is a semiconductor memory device which has stack type memory cells each comprising one MIS transistor and one MIS capacitor. A first conductive film having a predetermined thickness is arranged to overlay a memory node contact of a memory cell which corresponds to a source or drain region of the MIS transistor. A second conductive film is formed on the surface of the first conductive film to have a predetermined thickness and come in contact with the source or drain region by means of a memory node contact hole formed inside the memory node contact. The first and second conductive films form a capacitor electrode of the MIS capacitor.

19 Claims, 4 Drawing Sheets

SEMICONDUCTOR MEMORY DEVICE WITH STACK TYPE MEMORY CELL

BACKGROUND OF THE INVENTION

1. Field of the Invention

The present invention relates to an apparatus for a semiconductor memory device and a method of making a semiconductor memory device using a Dynamic Random Access Memory (DRAM) construction of the stack memory cell type.

2. Description of the Related Art

Due to the recent high demand for large-capacity semiconductor memory devices, increasingly greater integration is being employed in the design of these types of devices. Currently, one of the most widely used of these devices is the DRAM. In particular, DRAMs lend themselves to being highly integrable.

The memory cells constituting a DRAM are classified to three types according to the number of MOS transistors that constitute a single memory cell: four-transistor type, three-transistor type and one-transistor type. The one-transistor type comprises only one MOS capacitor for storing a charge (i.e., a high or low voltage charge), and one MOS transistor for transferring a charge. Because of its simpler structure and easier miniaturization than the other two types, the one-transistor type memory cell is typically employed in DRAMs of a 4K-bit size or of a greater size.

To achieve a larger memory capacity with a smaller area, various methods of providing a three-dimensional capacitance structure for the one-transistor type memory cells have been proposed. One of these methods provides for a stack type memory cell.

The stack type memory cell has a polysilicon-based multi-layer structure on a semiconductor substrate, wherein a dielectric film (silicon oxide or silicon nitride) is formed between a lower capacitor electrode (capacitor electrode) and an upper capacitor electrode (opposite electrode). One way to provide for larger capacity memories is to increase the surface area of the polysilicon film forming the capacitor electrode. This can be done by either decreasing or increasing the thickness of the polysilicon film layer.

FIG. 9 is a cross-sectional view of a stack type memory cell fabricated using conventional techniques wherein a thin layer of polysilicon film is used to form the capacitor electrode.

In this example, an N channel MOS transistor is used as a charge-transfer transistor. A pair of n+ type diffusion layers 102 and 103 are formed on a p type semiconductor substrate 101 and serve as the source and drain regions of an N channel MOS transistor. A gate electrode (word line) 105 is formed of a first polysilicon film, between the diffusion layers 102 and 103 via an interlayer insulating film 104. A gate oxide film 113 is formed between the gate electrode 105 and the semiconductor substrate 101.

A second polysilicon film 106 is formed on the interlayer insulating film 104 and serves as the capacitor electrode. The polysilicon film 106 contacts the diffusion layer 102 at a contact portion (memory node contact) D. A third polysilicon film 108 forms the opposite electrode on the polysilicon film 106. A dielectric film 107 is placed between the polysilicon films 107 and 108. A field oxide film 109, serving as a device isolating region, is formed adjacent to the diffusion layer 102 on the semiconductor substrate 101. A word line 110 is formed on the field oxide film 109 and adjoins the word line 105. An insulating layer 111, provided on the interlayer insulating film 104 and the polysilicon film 108, is overlaid by a bit line 112 which contacts the diffusion layer 103.

The memory node contact D has an inverted quadrangular pyramid having a cavity at the center due to the placement of word lines 105, 110 and the interlayer insulating film 104 as described above. By forming a thin layer of polysilicon film 106 along the interlayer insulating film 104, the surface area of the dielectric film 107 increases. The area shared by the opposite electrode (polysilicon film 108) and the capacitor electrode (polysilicon film 106) also increases as does the surface area of the dielectric film 107 lining the cavity of the memory node contact D.

FIG. 10 is a cross-sectional view of a stack type memory cell that is fabricated by forming a thick polysilicon film 106 for use as the capacitor electrode. The same reference numerals as used in the stack type memory cell shown in FIG. 9 will be given to denote the identical elements in FIG. 10. Given this thick polysilicon film 106 in the stack type memory cell as shown in FIG. 10, the area of the side-wall region (portion A) around the polysilicon film 106 likewise increases. This in turn results in an increase in the surface area of the dielectric film 107 which allows for the possibility of an enhanced memory capacity.

To increase the surface area of the dielectric film 107 in the stack type memory cell shown in FIG. 9, the diameter of the memory node contact D must be increased. This construction, however, tends to make the voltage charge, held by the cell, unstable. The greater the diameter of the memory node contact D, the thinner the interlayer insulating film 104 (portion B) between the individual word lines 105 and 110 and the capacitor electrode (polysilicon film 106). This results in an electrode which is unable to accommodate high voltage levels.

In the stack type memory cell shown in FIG. 10, the diameter of the memory node contact D is not associated with the surface area of the dielectric film 107. It is therefore possible to make the interlayer insulating film 104 (portion B) between the word lines 105 and 110 and the capacitor electrode 106 sufficiently thick, so that high voltage levels may be accommodated.

In the stack type memory cell shown in FIG. 9, the dielectric film 107 has a shape formed along the contour of the memory node contact D. Regardless of how thin the polysilicon film 106 is formed, an increase in the surface area of the dielectric film 107 is limited if the shape of the memory node contact D remains fixed.

In the stack type memory cell shown in FIG. 10, however, the surface area of the dielectric film 107 can increase as long as the polysilicon film 106 is formed thick. It should be noted that if a thick polysilicon film 106 is formed, a step portion in the bit line 112 will also increase. This will, in turn, likely cause the bit line 112 to be cut at the contact portion (portion E) between the bit line 112 and the diffusion layer 103. Effectively, this establishes a limit to increasing the thickness of the polysilicon film 106. Nonetheless, the stack type memory cell shown in FIG. 10 has enjoyed more widespread use than the stack type memory cell shown in FIG. 9.

Recent trends in DRAM design and manufacture have led to the further miniaturization of the stack type memory cell. Unfortunately, use of the stack type memory cell, as shown in FIG. 10, entails a limit to the range with which the DRAM's memory capacity can be effectively increased. Therefore, there is an unmet demand to increase the surface area of the dielectric film 107 in order to enhance the DRAM's memory capacity without causing an increase in the area occupied by the DRAM's memory cell.

SUMMARY OF THE INVENTION

It is therefore an object of the present invention to provide a semiconductor memory device whose memory capacity can be increased while reducing the area occupied by the memory cell on the semiconductor substrate.

To achieve the above objective, a semiconductor memory device embodying the present invention has stack type memory cells each comprising one MIS transistor and one MIS capacitor. A first conductive film having a predetermined thickness is arranged to encase a memory node contact of a memory cell which corresponds to a source or drain region of the MIS transistor. A second conductive film is formed on the surface of the first conductive film to have a predetermined thickness and come in contact with the source or drain region via a memory node contact hole formed inside the memory node contact. The first and second conductive films form a capacitor electrode of the MIS capacitor.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENT

One embodiment of the present invention will now be described referring to the accompanying drawings.

Figure 1:
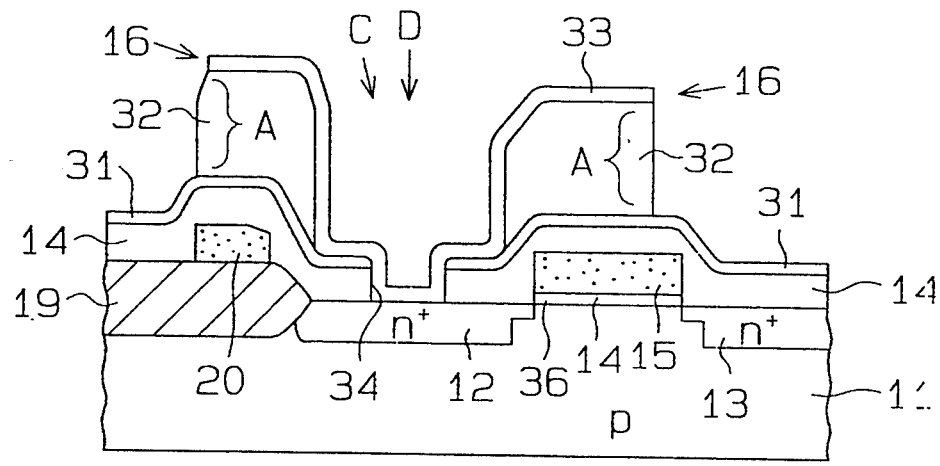
FIG. 1 is a cross-sectional view showing the structure of a semiconductor memory device according to one embodiment of the present invention.

FIG. 1 illustrates a cross-sectional view showing the structure of a capacitor electrode of a stack type memory cell according to this embodiment. In particular, this view is illustrative of a completed capacitor electrode portion of a stack type memory cell. The portion which lies above the capacitor electrode is not illustrated.

In this embodiment, an N channel MOS transistor is used as a charge-transfer transistor. Formed on a p type semiconductor substrate 11 are n+ type diffusion layers 12 and 13, which serve as source and drain regions of an N channel MOS transistor. A gate electrode (word line) 15 is formed of a polysilicon film, between the diffusion layers 12 and 13 via an interlayer insulating film 14. A gate oxide film 36 is formed between the gate electrode 15 and the semiconductor substrate 11. A field oxide film 19 serving as a device isolating region is formed adjacent to the diffusion layer 12 on the semiconductor substrate 11. A word line 20 is deposited on the field oxide film 19 and adjoins the word line 15. A silicon nitride film 31 is formed on the interlayer insulating film 14. Formed on the silicon nitride film 31 is a polysilicon film 16, which forms a capacitor electrode. The polysilicon film 16, which is formed of a double-layer structure of polysilicon films 32 and 33, contacts the diffusion layer 12 at a contact portion (memory node contact) D.

The polysilicon film 32, as a first conductive film, has a shape of a thick doughnut, with the center hole C arranged to match with the memory node contact D. The polysilicon film 33, as a second conductive film, is a thin film covering the surface of the polysilicon film 32 which comes in contact with the diffusion layer 12 in a memory node contact hole 34. The thickness of the first conducive polysilicon film 32, can according to various embodiments of the present invention range, for example, from a thickness of 6,000 to 10,000 Å. The thickness of the second conductive polysilicon film 33, according to various embodiments of the present invention, can range, for example, between 500 to 1000 Å.

The fabrication of the stack type memory cell of this embodiment will now be discussed with reference to a plurality of fabricating steps shown in FIGS. 2 to 7, 1 and 8 in the named order.

Figure 2:
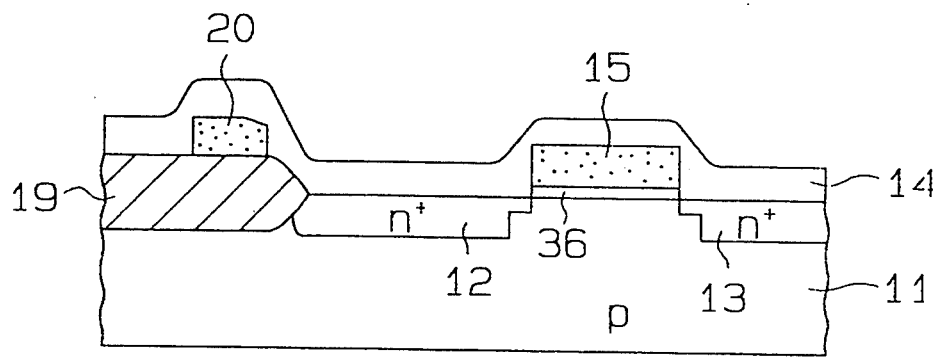
FIGS. 2 through 7 are cross-sectional views for explaining a plurality of steps of manufacturing the semiconductor memory device according to this embodiment.

As shown in FIG. 2, the n+ type diffusion layers 12 and 13, the field oxide film 19, the gate oxide film 36 and the word lines 15 and 20 are formed on the p type semiconductor substrate 11. Then, the interlayer insulating film 14 is formed of a silicon oxide film to a predetermined thickness (e.g., 3000 Å) by the low pressure CVD (Chemical Vapor Deposition) method (film forming temperature: 810° C.).

Figure 3:
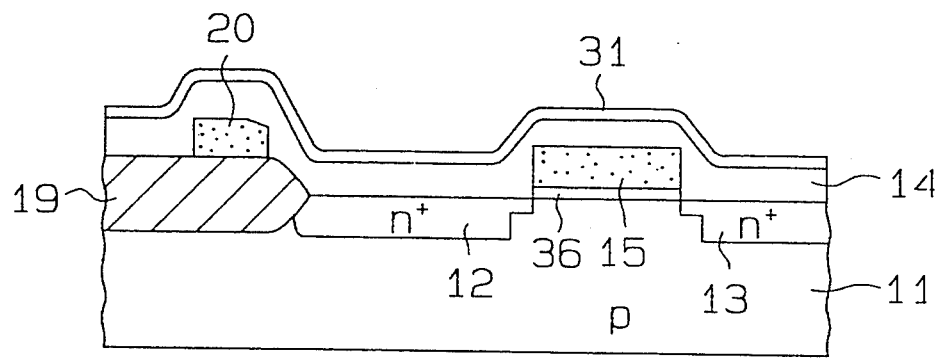

Next, as shown in FIG. 3, the silicon nitride film 31 is formed on the surface of the interlayer insulating film 14 to a predetermined thickness (e.g., 500 Å) by the low pressure CVD method (film forming temperature: 770° C.).

Figure 4:
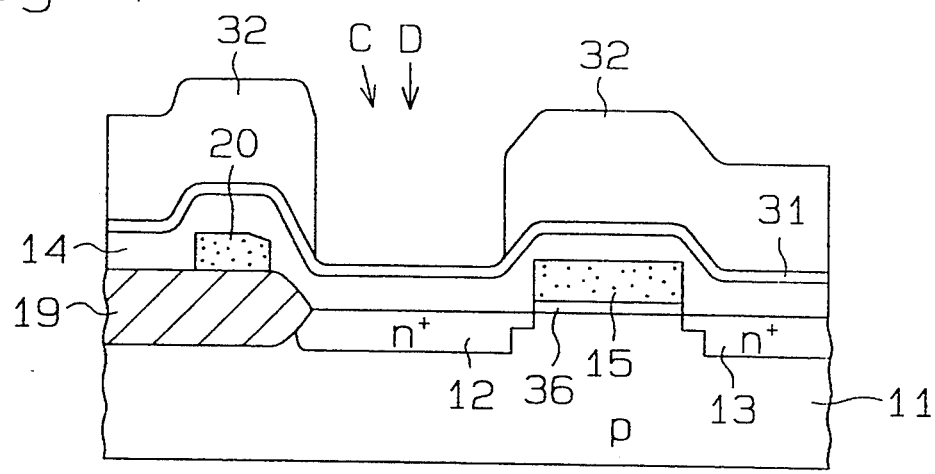

Next, as shown in FIG. 4, the polysilicon film 32 is formed on the surface of the silicon nitride film 31 to a predetermined thickness (e.g., 6000 Å) by the low pressure CVD method (film forming temperature: 620° C.). At the time of forming the polysilicon film 32, phosphine is added to the raw-material gas to dope phosphorus of high concentration in the polysilicon film 32, making the polysilicon film 32 have a low resistance. The polysilicon film 32, at the portion corresponding to the memory node contact D, is removed to form a center hole C by the proper etching method (wet etching, dry etching, a combination of wet etching and dry etching, etc.), thereby exposing the silicon nitride film 31. At this time, the diameter of the center hole C of the polysilicon film 32 is set larger than that of the memory node contact hole 34.

Figure 5:
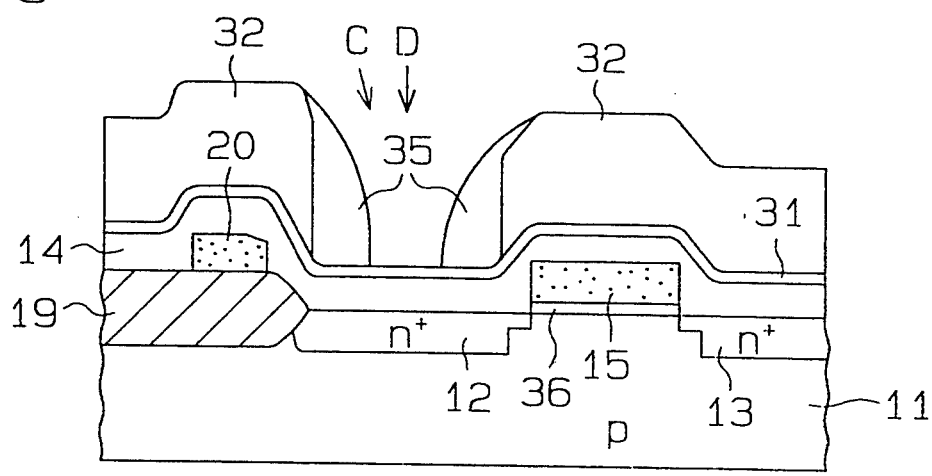

Next, as shown in FIG. 5, a silicon oxide film is formed on the surface of the polysilicon film 32 and in the center hole C to a predetermined thickness (e.g., 3000 Å) by the atmospheric pressure CVD method (film forming temperature: 420° C.). Then, the silicon oxide film formed on the surface of the polysilicon film 32 and in the center hole C is removed by a full etchback method in such a way that only a side-wall spacer 35 remains on the inner wall of the center hole C of the polysilicon film 32.

Figure 6:
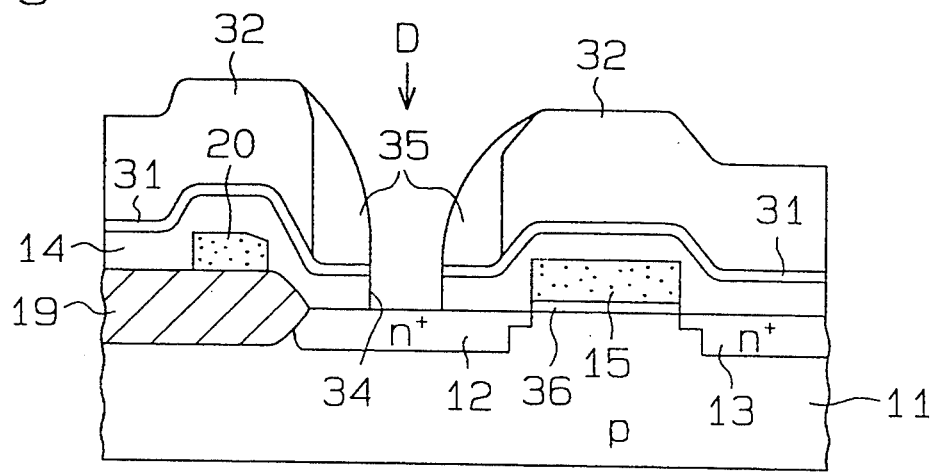

Subsequently, with the side-wall spacer 35 and polysilicon film 32 used as etching masks, the memory node contact hole 34 is formed by a self-align contact method as shown in FIG. 6.

Figure 7:
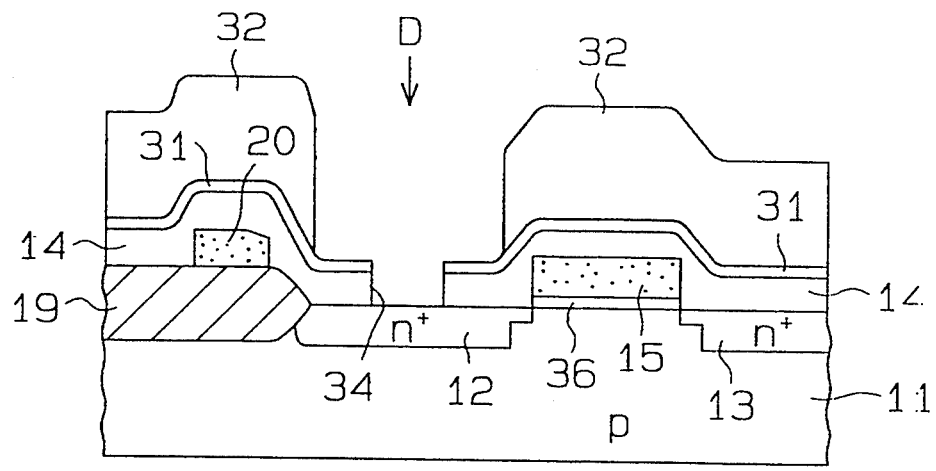

Next, as shown in FIG. 7, the silicon nitride film 31 is left and only the side-wall spacer 35 is removed by an etching method (e.g., wet-etching method using hydrofluoric acid) which gives a high etching ratio for the silicon nitride film with respect to the silicon oxide film. At this time, the silicon nitride film 31 serves as an etching stopper when the side-wall spacer 35 is etched out.

Next, as shown in FIG. 1, the polysilicon film 33 is formed on the surface of the polysilicon film 32 to a predetermined thickness (e.g., 500 Å) by the low pressure CVD method (film forming temperature: 620° C.). At the time of forming the polysilicon film 33, as in the case of the polysilicon film 32, phosphine is added to the raw-material gas to dope phosphorus of high concentration in the polysilicon film 33, reducing the resistance of the polysilicon film 33. The polysilicon films 32 and 33 are etched out simultaneously by the proper etching method, so that the side-wall region (portion A) around the polysilicon film 16, which is formed by the polysilicon films 32 and 33, is patterned into the same shape as the side-wall region (portion A) around the polysilicon film 106 shown in FIG. 10.

Figure 8:
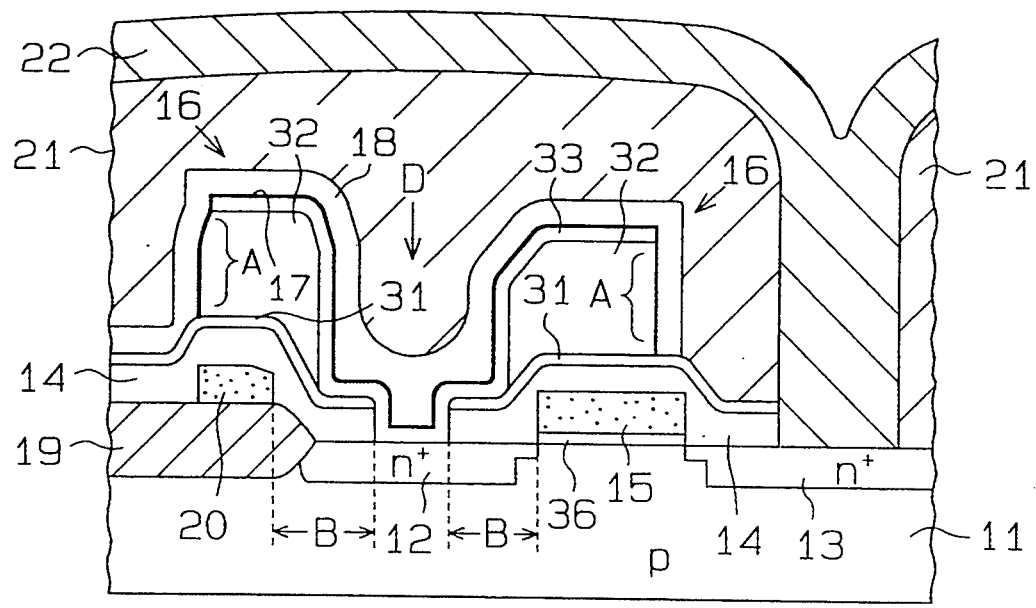
FIG. 8 is a cross-sectional view showing the structure of a semiconductor memory device according to this embodiment.

Next, as shown in FIG. 8, a thin silicon nitride film is formed on the surface of the polysilicon film 16 and the surface of this silicon nitride film is oxidized by the low pressure CVD method. As a result, the dielectric film 17 with a nitride/oxide structure or NO structure is formed. Then, the polysilicon film 18, which forms the opposite electrode, is formed on the dielectric film 17 by the low pressure CVD method. Next, an insulating layer 21 is formed on the polysilicon film 18, followed by formation of a bit line 22 which is formed on the insulating layer 21. This completes the formation of the stack type memory cell of this embodiment.

According to this embodiment, as described above, the polysilicon film 16 which forms a capacitor electrode is formed by both polysilicon films 32 and 33.

Figure 10:
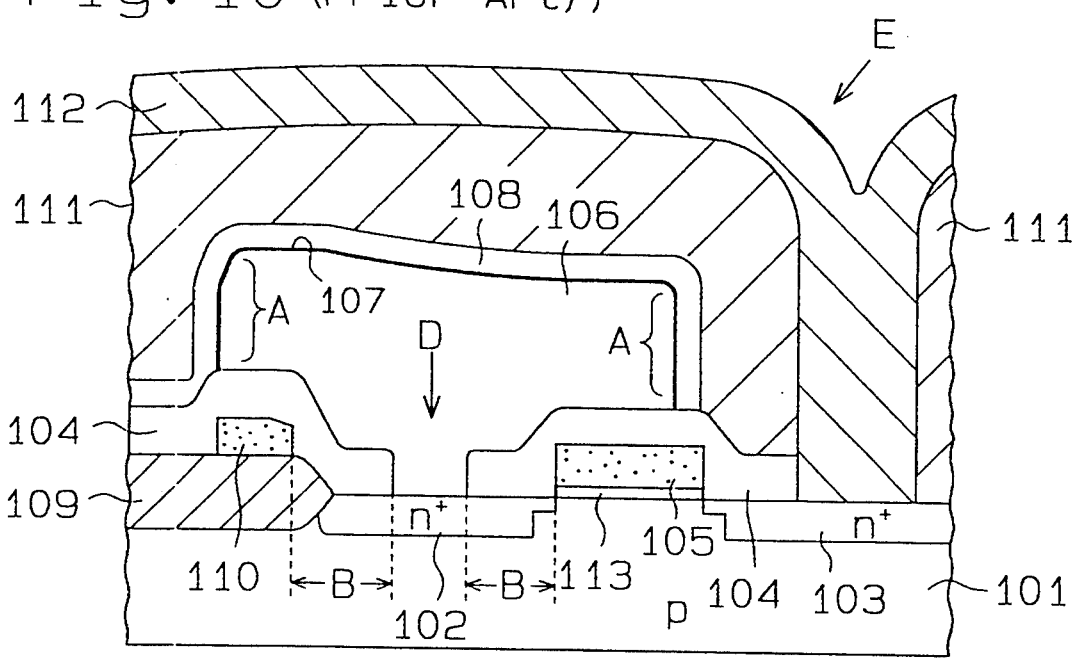
FIG. 10 is a cross-sectional view showing the structure of another conventional semiconductor memory device.

If the area of the side-wall region (portion A) around the polysilicon film 16 is increased by forming a thick layer of polysilicon film 32, the surface area of the dielectric film 17, like that of the dielectric film 107 of the prior art shown in FIG. 10, increases. This results in a DRAM design which allows for increased memory capacity.

Specifically, when a thick layer of polysilicon film 32 is used, a deep cavity forms in the center of the polysilicon film 16 corresponding to the memory node contact D. The surface area of the dielectric film 17 increases due to the cavity at the center of the polysilicon film 16, thereby enhancing the memory capacity.

Figure 9:
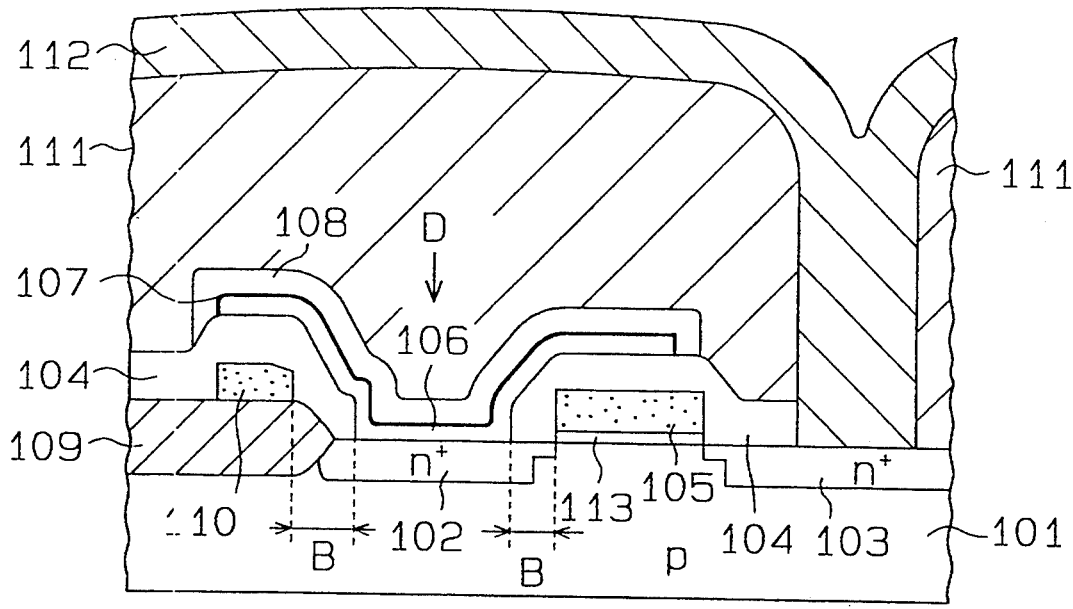
FIG. 9 is a cross-sectional view showing the structure of a conventional semiconductor memory device.

In other words, this method increases the surface area of the dielectric film 17 using the cavity of the memory node contact D in the region lying inward of the capacitor electrode (polysilicon film 16). This method also increases the surface area of the dielectric film 17 using the side-wall region (portion A) around the capacitor electrode. That is, this embodiment produces the effects provided by the prior art shown in both FIGS. 9 and 10. The present embodiment thus ensures the possibility of providing for a higher memory capacity than did the conventional design of the prior art.

Further, according to this embodiment, the side-wall spacer 35 and polysilicon film 32 are used as etching masks allowing the memory node contact hole 34 to be formed by a self-align contact method. Thus, the position of the opening of the memory node contact hole 34 is optimized. By properly adjusting the shape of the side-wall spacer 35, the interlayer insulating film 14 between the individual word lines 15 and 20 and the capacitor electrode 16 (portion B shown in FIG. 8) can be formed sufficiently thick, thus making it easier to accommodate high voltage levels.

As described above in detail, this invention will provide a semiconductor memory device whose memory capacity can be increased while reducing the area occupied by the memory cell on the semiconductor substrate.

The present invention is not limited to the above-described embodiment, and may be worked out in other manners as will be discussed below.

1) The low pressure CVD method in the individual fabricating steps shown in FIGS. 2, 3, 4, 6 and 8 may be replaced with the atmospheric pressure CVD method. The atmospheric pressure CVD method in the fabricating step shown in FIG. 5 may be replaced with the low pressure CVD method.

2) At the time of reducing the resistances of the polysilicon films 32 and 33, phosphorus may be ion-injected after, not when, those polysilicon films 32 and 33 are formed by the CVD method. In this case, after the ion-injection of phosphorus is carried out (an example of the injecting condition: acceleration voltage of 20 KeV and an injecting amount of $1.0 \times 10^{15}$ cm$^{-2}$), a heat treatment is performed (e.g., under the nitride atmosphere at 900° C. for 15 minutes) to activate the injected ions.

3) At the time of reducing the resistances of the polysilicon films 32 and 33, impurities to be doped may be other proper materials than phosphorus (such as arsenic, antimony, phosphorus oxychloride, etc.).

4) The silicon nitride film 31 may be replaced with a silicon oxide film, and the side-wall spacer 35 may be formed by a silicon nitride film, not a silicon oxide film.

5) The silicon nitride film 31 may be replaced with a proper insulating layer, and the side-wall spacer 35 may be formed of a proper material whose etching ratio differs from that of this insulating layer.

6) The interlayer insulating film 14 is not limited to a silicon oxide film, and may be any insulating film, such as a silicon nitride film, alumina or silicate glass). When a different material from a silicon oxide film is used for the interlayer insulating film 14, an MOS (Metal Oxide Semiconductor) transistor and an MOS capacitor become an MIS (Metal Insulator Semiconductor) transistor and an MIS capacitor in a broader sense.

7) The polysilicon film 33 may be replaced with an HSG (Hemispherical Grain) polysilicon film. In this case, the surface of the polysilicon film 33 becomes rough, further increasing the surface area of the dielectric film 17, so that this invention becomes more effective. The details on the method of forming an HSG polysilicon film are given in a report from Micro Electronics Laboratory in NEC Corporation (Kasai, Sakao, et. al., Shingaku Technology, Vol. 90, SDM90-202, p. 47, 1990).

8) A needle-like residual matter is formed on the polysilicon films 33 and 32 by the method which will be discussed below. First, an oxide film is formed on the surface of the polysilicon film 33, and an HSG polysilicon film is formed on that oxide film with a proper area ratio. Then, with the HSG polysilicon film as an etching mask, the oxide film on the surface of the polysilicon film 33 is etched. Subsequently, with the remaining oxide film as an etching mask, the polysilicon films 33 and 32 are selectively etched, forming a needle-like residue on the polysilicon films 33 and 32. In this case, the surface of the polysilicon films 33 and 32 becomes rough, further increasing the surface area of the dielectric film 17, so that this invention becomes more effective. The details on the method of forming a needle-like residue on the polysilicon films are given in a report from R & D Center, Semiconductor Business, Sam Sung Electronics (J. H. Ahn, Y. W. Park, et. al., 1992 Symposium on VLSI Technology Digest of Technical Papers, P. 12, 1992).

9) As disclosed in Japanese Unexamined Patent Publication No. Hei 4-302468, the top of the polysilicon film 32 becomes rough. As the surface of the polysilicon film 33 becomes rough in this case too, the surface area of the dielectric film 17 is increased further, so that this invention becomes more effective.

10) The dielectric film 17 may have an ONO structure of oxide/nitride/oxide or an ON structure of oxide/nitride, instead of the NO structure.

11) As the dielectric film 17, a high dielectric film may be used, such as PZT ($PbZr_{1-x}Ti_xO_3$), PLZT ($Pb_{1-x}La_xZr_{1-y}Ti_yO_3$), BTO ($BaTiO_3$), BST ($Ba_{1-x}Sr_xTiO_3$), STO ($SrTiO_3$) or $Ta_2O_5$. In this case, the capacitance of the MOS capacitor is increased, so that this invention becomes more effective.

12) As a charge transfer transistor, a P channel MOS transistor may be used. That is, the semiconductor substrate 11 has a n type conductivity, and each diffusion layer has a p+ type conductivity. Then, a p type impurity (boron, indium, etc.) is doped into the polysilicon films 32 and 33.

13) It is preferable that the polysilicon film 32 is as thick as possible in terms of the increase of memory capacity. However, the thickness of polysilicon film 32 is preferably in the range of 6,000 to 10,000 Å in terms of the compactness of memory cell.

14) It is preferable that the polysilicon film 33 is as thin as possible in terms of the increase of memory capacity. However, the thickness of polysilicon film 33 is preferably in the range of 500 to 1,000 Å in terms of the characteristics and easily forming of the film.

What is claimed is:

1. A semiconductor memory device having stack type memory cells, each of said cells comprising a MIS transistor and a MIS capacitor, said semiconductor memory device comprising:
    a first conductive film with a predetermined thickness and defining a center hole that overlies a memory node contact of a memory cell corresponding to one of a source and a drain region of said MIS transistor; and
    a second conductive film, formed on a surface of the first conductive film, having a predetermined thickness and contacting the memory node contact of a memory cell corresponding to one of a source and drain region of said MIS transistor through a memory node contact hole formed within said center hole, said first and second conductive films forming a capacitor electrode of said MIS capacitor wherein said second conductive film has a substantially staircase shape comprised of at least three substantially horizontal portions that are separated from one another by two substantially vertical positions.

2. The semiconductor memory device according to claim 1, wherein said first conductive film and said second conductive film are formed of a polysilicon film doped with an impurity.

3. The semiconductor memory device according to claim 1, wherein said MIS transistor is an MOS transistor and said MIS capacitor is an MOS capacitor.

4. The semiconductor memory device according to claim 1, wherein a thickness of said first conductive film is formed having a thickness of 6000 Å to 10,000 Å.

5. The semiconductor memory device according to claim 1, wherein said second conductive film is formed having a thickness of 500 Å to 1,000 Å.

6. A method of fabricating a semiconductor memory device as recited in claim 1, comprising:
    a first step of forming an MIS transistor on a semiconductor substrate;
    a second step of forming an insulating layer on said MIS transistor;
    a third step of forming a first conductive film on said insulating layer;
    a fourth step of removing a portion of said first conductive film, corresponding to a memory node contact of said memory cell and to a source or drain region of said MIS transistor, in order to expose said insulating layer;
    a fifth step of forming a side-wall spacer on an inner wall of that portion of said first conductive film which corresponds to said memory node contact, said spacer being formed from a material having a different etching selecting ratio from that of said insulating layer;
    a sixth step of etching said insulating layer with said side-wall spacer used as an etching mask by a self-align contact method, thereby forming a memory node contact hole;
    a seventh step of etching out said side-wall spacer with said insulating layer used as an etching resist; and
    an eighth step of forming a second conductive film on said insulating layer and said first conductive film and inside said memory node contact hole, said second conductive film and said first conductive film forming a capacitor electrode of an MIS capacitor.

7. The method according to claim 6, wherein said insulating layer comprises one of a silicon nitride film and a silicon oxide film.

8. The method according to claim 6, wherein said first conductive film and said second conductive film are formed of a polysilicon film doped with an impurity by one of a diffusion and an ion injection method.

9. The method according to claim 6, wherein a partial removal of said first conductive film in said fourth step is carried out by at least one of wet etching, dry etching, and a combination of wet etching and dry etching methods.

10. The method according to claim 6, wherein said side-wall spacer comprises one of a silicon oxide film and a silicon nitride film.

11. The method according to claim 6, wherein said side-wall spacer is formed using full etch-back etching.

12. The method according to claim 6, wherein said side-wall spacer comprises silicon oxide that is etched by a wet-etching method wherein hydrofluoric acid is used, said hydrofluoric acid being resisted by an insulating layer formed of a silicon nitride film.

13. The method according to claim 6, wherein said insulating layer, said first conductive film, said second conductive film and said side-wall spacer are formed by the low pressure CVD method or atmospheric pressure CVD method.

14. The method according to claim 6, wherein said second conductive film is an Hemispherical Grain polysilicon film.

15. The method according to claim 6 further comprising:
depositing an oxide film on said second conductive film after depositing said second conductive film on said first conductive film, depositing a Hemispherical Grain (HSG) polysilicon film on a first portion of said oxide film, said HSG film forming a mask over a second portion of said oxide film,
using a first etching procedure to etch the second portion of said oxide film according to the mask defined by said HSG film, said etched portion of said oxide film forming a mask over the first and second conductive film,
using a second etching procedure for etching a portion of said first and second conductive layers corresponding to the oxide film mask, said second etching procedure further functioning to produce a needle-like residue on the etched surfaces of said first and second conductive film.

16. The method according to claim 6, wherein a rough surface is formed on a top of said capacitor electrode.

17. The method according to claim 8, wherein said impurity to be doped is one selected from a group consisting of phosphorus, arsenic, antimony, phosphorus oxychloride, boron, and indium.

18. A semiconductor memory device having stack type memory cells, each cell of which comprises a MOS transistor and a MOS capacitor, the semiconductor memory device comprising:
a first conductive film defining a center hole that overlies a memory node contact of a memory cell corresponding to one of a source and a drain regions of the MOS transistor, said first conductive film being formed from a polysilicon film of from 6,000 Å to 10,000 Å thick doped with an impurity;
a second conductive film formed on a surface of the first conductive film, having a predetermined thickness and contacting the memory node contact of a memory cell corresponding to one of a source and drain regions of said MIS transistor through a memory node contact hole formed within said center hole, said second conductive film being from 500 Å to 1,000 Å thick and being formed from a polysilicon film doped with an impurity, said memory node contact hole having a smaller diameter than that of the center hole and said first and second conductive films forming a capacitor electrode of the MOS capacitor wherein said second conductive film has a substantially staircase shape comprised of at least three substantially horizontal portions that are separated from one another by two substantially vertical portions.

19. A method of fabricating a semiconductor memory device as recited in claim 1, comprising:
a first step of forming an MIS transistor on a semiconductor substrate;
a second step of forming an insulating layer on said MIS transistor, said insulating layer being one of silicon nitride film and silicon oxide film formed using one of a normal pressure CVD (Chemical Vapor Deposition) method and a low pressure CVD method;
a third step of forming a first conductive film on said insulating layer, said first conductive film being formed from polysilicon film doped with an impurity by one of a diffusion method and an ion injection method, said impurity being one selected from a group consisting of phosphorous, arsenic, antimony, phosphorus oxychloride, boron, and indium;
a fourth step of removing a portion of said first conductive film corresponding to a memory node contact of said memory cell and to one of a source and a drain region of said MIS transistor in order to expose said insulating layer, said removal step being performed by at least one of a wet etching method, a dry etching method, and a combination of wet etching and dry etching methods;
a fifth step of forming a side-wall spacer of a material having a different etching selecting ratio from that of said insulating layer, on an inner wall of that portion of said first conductive film which corresponds to said memory node contact, said side-wall spacer being formed from one of silicon oxide film and silicon nitride film;
a sixth step of etching said insulating layer with said side-wall spacer used as an etching mask by a self-align contact method, thereby forming a memory node contact hole;
a seventh step of etching out said side-wall spacer with said insulating layer used as an etching stopper, said etching being carried out according to wet etching method using fluorine; and
an eighth step of forming a second conductive film on said insulating layer and said first conductive film, as well as inside said memory node contact hole, said second conductive film being formed of a polysilicon film produced by way of one of the normal pressure CVD method and the low pressure CVD method, said polysilicon film being doped with an impurity which is one selected from a group consisting of phosphorous, arsenic, antimony, phosphorus oxychloride, boron, and indium, and said impurity being doped by diffusion or ion injection, and said second conductive film and said first conductive film forming a capacitor electrode of an MIS capacitor.

* * * * *

UNITED STATES PATENT AND TRADEMARK OFFICE
CERTIFICATE OF CORRECTION

PATENT NO.  : 5,444,653
DATED       : August 22, 1995
INVENTOR(S) : Nagasawa et al.

It is certified that error appears in the above-identified patent and that said Letters Patent is hereby corrected as shown below:

On the title page, item [54] should read -- Hideharu Nagasawa of Osaka, Japan, Kazunari Honma; Yasuhiro Takeda; Kiyoshi Yoneda, of Gifu, Japan Signed and Sealed this Fourteenth Day of November, 1995

*Attest:*

BRUCE LEHMAN

*Attesting Officer*      *Commissioner of Patents and Trademarks*